US006410389B1

United States Patent

(12) United States Patent
Cappelletti et al.
(10) Patent No.: US 6,410,389 B1
(45) Date of Patent: Jun. 25, 2002

(54) NON-VOLATILE MEMORY CELL WITH A SINGLE LEVEL OF POLYSILICON, IN PARTICULAR OF THE FLASH EEPROM TYPE, AND METHOD FOR MANUFACTURING THE SAME

(75) Inventors: Paolo Cappelletti, Seveso; Alfonso Maurelli, Sulbiate; Nicola Zatelli, Bergamo, all of (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/684,721

(22) Filed: Oct. 6, 2000

(30) Foreign Application Priority Data

Oct. 7, 1999 (EP) .......................................... 99830629

(51) Int. Cl.[7] .......................................... H01L 21/336

(52) U.S. Cl. ...................................... 438/257; 438/264

(58) Field of Search ................................ 438/257, 281, 438/286, 294, 307, 592, 651, 655, 656, 664, 201, 232, 261, 264, 289, 308, 555

(56) References Cited

U.S. PATENT DOCUMENTS

| | | | | |
|---|---|---|---|---|
| 4,257,056 A | * | 3/1981 | Shum | 357/59 |
| 5,504,706 A | | 4/1996 | D'Arrigo et al. | 365/185.18 |
| 5,633,186 A | * | 5/1997 | Shum et al. | 438/264 |
| 5,751,036 A | * | 5/1998 | Tanaka | 257/315 |
| 5,814,866 A | | 9/1998 | Borland | 257/369 |
| 5,844,271 A | | 12/1998 | Sethi et al. | 257/318 |
| 6,157,057 A | * | 12/2000 | Sheu et al. | 257/315 |
| 6,211,074 B1 | * | 4/2001 | Huang et al. | 438/655 |

FOREIGN PATENT DOCUMENTS

| | | | |
|---|---|---|---|
| EP | 0 272 732 A2 | | 6/1988 |
| EP | 0 776 049 A1 | | 5/1997 |
| EP | 0 820 103 A1 | | 1/1998 |
| JP | 10223782 | * | 8/1998 |
| WO | WO 98/19343 | | 5/1998 |
| WO | WO98/47150 | | 10/1998 |

* cited by examiner

*Primary Examiner*—David Nelms
*Assistant Examiner*—Phuc T. Dang
(74) *Attorney, Agent, or Firm*—Lisa K. Jorgenson; David V. Carlson; SEED IP Law Group PLLC

(57) ABSTRACT

The memory cell is of the type with a single level of polysilicon, and is produced in a substrate of semiconductor material with a first type of conductivity, and comprises a control gate region with a second type of conductivity, formed in the substrate in a first active region; regions of source and drain with the second type of conductivity, formed in the substrate in a second active region; and a floating gate region which extends transversely relative to the first and the second active regions. The control gate region is surrounded by a first well with the first type of conductivity, which in turn is surrounded, below and laterally, by a third well with the second type of conductivity. The regions of source and drain are accommodated in a second well with the first type of conductivity, which in turn is surrounded below and laterally by a fourth well with the second type of conductivity.

21 Claims, 11 Drawing Sheets

NON-VOLATILE MEMORY CELL WITH A SINGLE LEVEL OF POLYSILICON, IN PARTICULAR OF THE FLASH EEPROM TYPE, AND METHOD FOR MANUFACTURING THE SAME

TECHNICAL FIELD

The present invention relates to a non-volatile memory cell with a single level of polysilicon, in particular of the flash EEPROM type, and to a method for manufacturing this cell.

BACKGROUND OF THE INVENTION

As is known, the semiconductors market is requiring, increasingly more urgently, memory devices which are embedded in other electronic devices, for example advanced-logic devices such as microprocessors. In this type of application, it is necessary firstly to guarantee the functionality and reliability of the memory device, and secondly to keep unchanged as far as possible the performance of the advanced-logic device, on the technological platform and the macro-cell libraries on which the manufacturing methods of the incorporated devices are founded and based. These methods additionally require reduction as far as possible of the method steps which are in addition to those commonly used for production of the advanced-logic devices. In order to achieve this, it is therefore necessary to have memory cells which are highly compatible with the production methods for these advanced-logic devices, with consequent lower production costs; the circuitry which makes the cells function must also be more efficient and simple.

At present, for this purpose, inter alia, memory cells with a single level of polysilicon are used.

FIGS. 1, 2 and 3 show in detail a memory cell 2 of the flash EEPROM type, with a single level of polysilicon included in a memory device 1, comprising a substrate 3 of semiconductor material with a first type of conductivity, and in particular P.

The memory cell 2 comprises a diffuse control gate region 6, with a second type of conductivity, in particular N, formed in the substrate 3, in a first active region 30 delimited by field oxide portions 10; regions of source 4*a*, 4*b* and drain 5*a*, 5*b* of type N, formed in the substrate 3, in a second active region 31, which is also delimited by field oxide portions 10, and is adjacent to the first active region 30; a gate oxide region 7 which covers the first active region 30, and a tunnel oxide region 8, which is less thick than the gate oxide region 7, and covers the second active region 31.

A floating gate region 9, made of polycrystalline silicon, extends transversely relative to the first 30 and to the second 31 active regions; in the first active region 30, the floating gate region 9 is isolated from the diffuse control gate 6 by means of the gate oxide region 7, whereas in the second active region 31, the floating gate region 9 is isolated from the substrate 3 and from the regions of source 4*a*, 4*b* and drain 5*a*, 5*b*, by means of the tunnel oxide region 8. Laterally relative to the floating gate region 9, spacers 11, 12 made of isolating material are provided.

FIGS. 4 to 7*b* show in succession some steps of the method for production of the memory cell 2. FIGS. 4, 5*a*, 6*a*, 7*a*, 8*a* are cross-sectional views along line II—II of FIG. 1 and FIGS. 5*b*, 6*b*, 7*b*, 8*b* are cross-sectional views along line III—III of FIG. 1.

In greater detail, starting from the substrate 3, after portions of field oxide 10 have been grown (FIG. 4), a layer of photo-sensitive material is deposited, in order to produce a capacitive implant mask 40, which leaves bare the first active region 30 and portions of the second active region 31. Then, using the mask 40, the diffuse control gate region 6 and the regions of source 4*a* and drain 5*a* are formed in the first 30 and in the second 31 active regions, by means of implantation and subsequent diffusion of a doping material, which is typically arsenic or phosphorous (FIGS. 5*a*, 5*b*). The gate oxide 7 and tunnel oxide 8 regions are then produced in the active regions 30 and 31.

A polycrystalline silicon layer is then deposited and removed selectively, in order to define the floating gate region 9 of the memory cell 2 (FIGS. 7*a*, 7*b*).

The method then continues with formation of the self-aligned regions of source 4*b* and drain 5*b*, and with formation of the floating gate region 9 and of the spacers 11 and 12 (FIG. 3).

Although it is advantageous in various respects, the known memory cell has the disadvantages that it is not highly compatible with the new methods for production of the electronic devices in which the memory device 1 is incorporated, and it requires complex circuitry in order to function, and is thus costly to produce. In particular, during erasure, it is necessary to generate and transfer a high voltage (for example of up to 16 V) to the source region of the cell, which involves considerable difficulties.

SUMMARY OF THE INVENTION

An embodiment of the invention is directed to a non-volatile memory cell with a single level of polysilicon. The non-volatile memory cell includes a substrate of semiconductor material, a control gate region, source and drain regions, and a floating gate region. The substrate has a first type of conductivity and includes first and second active regions adjacent to each other. The source and drain regions have a second type of conductivity and are formed in the second active region. The floating gate region extends above the substrate and transversely relative to the first and second active regions. The control gate region has the second type of conductivity and is formed in a triple-well structure in the first active region. The triple-well structure includes an isolation region having the second type of conductivity and an isolated region having the first type of conductivity. The isolated region surrounds the control gate region is enclosed below and laterally by the isolation region.

BRIEF DESCRIPTION OF THE DRAWINGS

The characteristics and advantages of the memory cell and of the corresponding production method according to the invention will become apparent from the following description of an embodiment, provided by way of non-limiting example with reference to the attached drawings, in which.

DETAILED DESCRIPTION OF THE INVENTION

Figure 8:
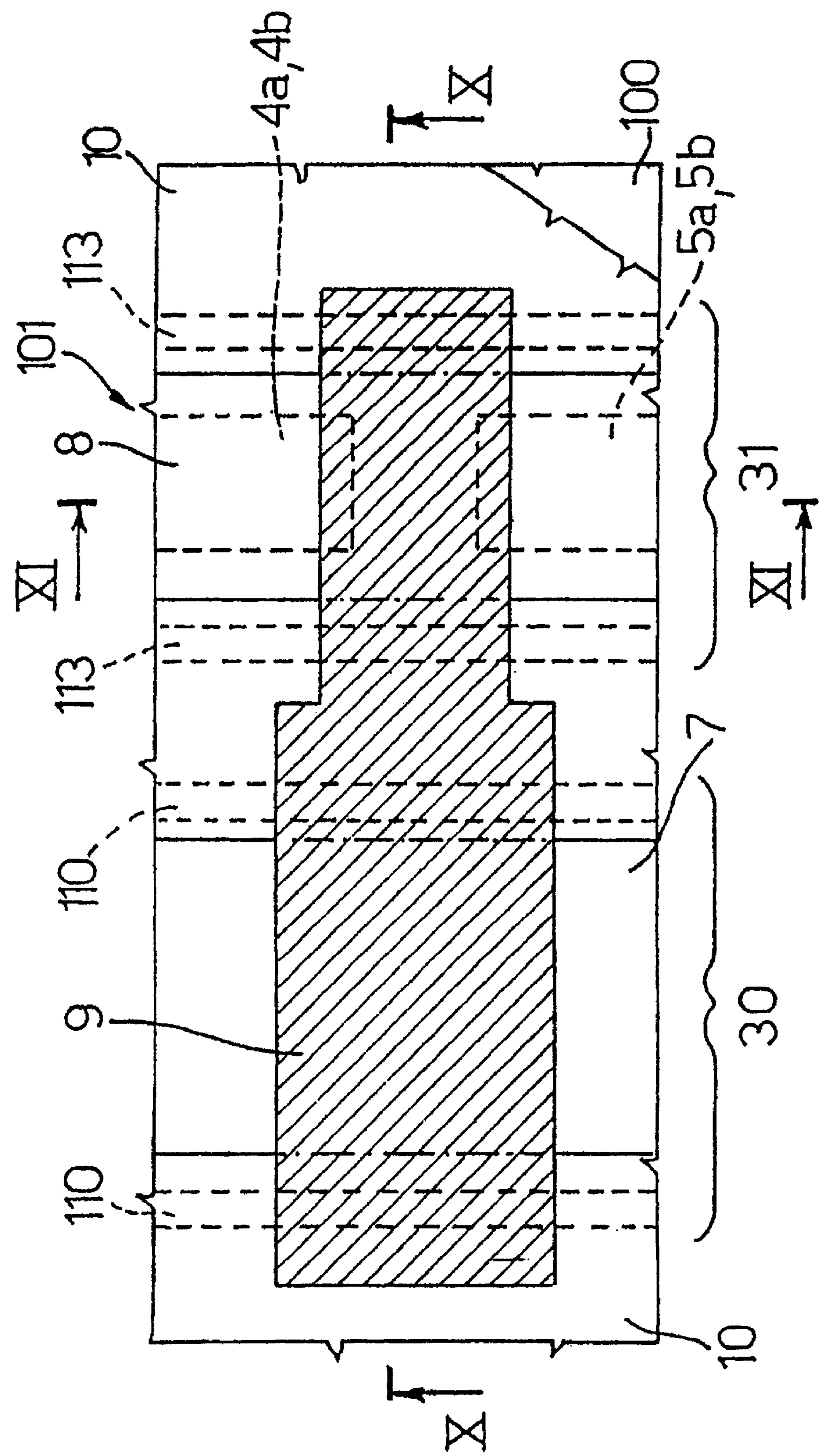
FIG. 8 is a plan view of a memory cell according to the invention, with a single level of polysilicon, and of the flash EEPROM type.
Figure 9:
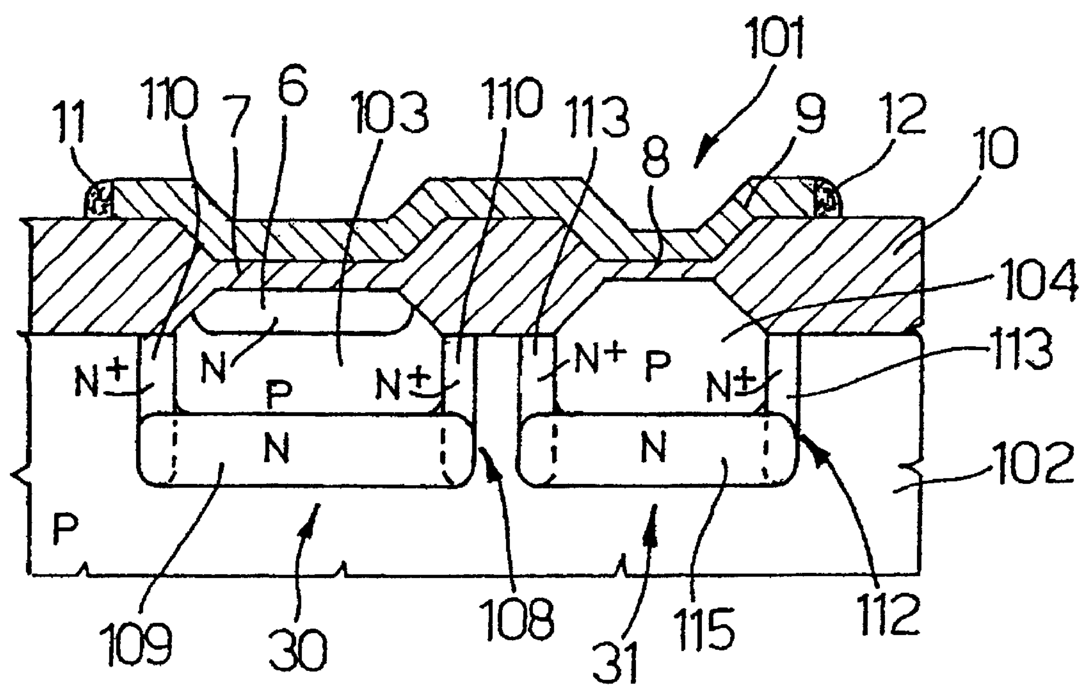
FIG. 9 is a transverse cross-section along line X—X in the memory cell of FIG. 8.
Figure 10:
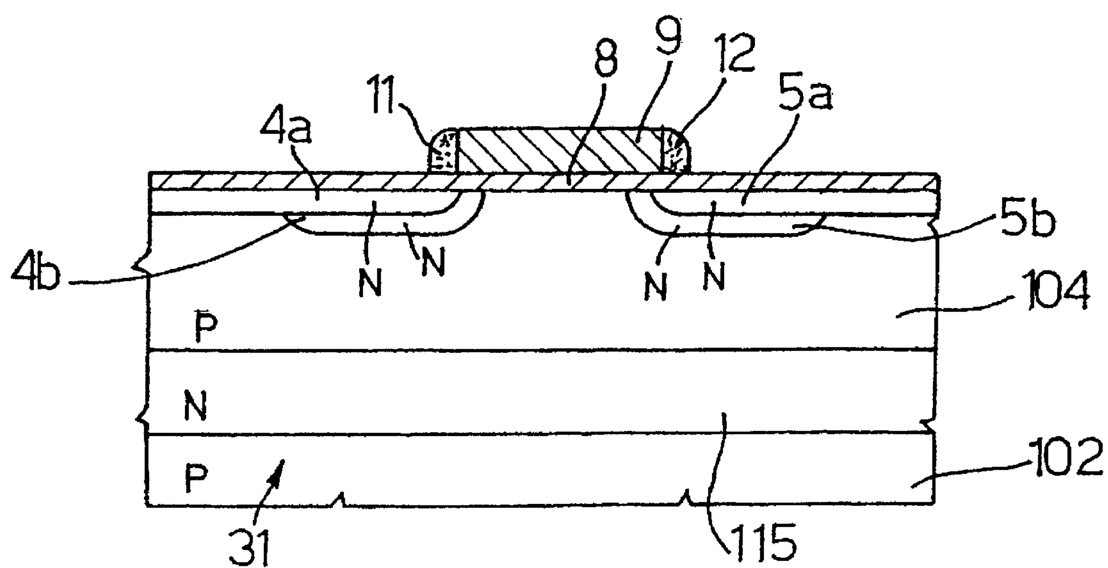
FIG. 10 is a transverse cross-section along line XI—XI in FIG. 8, of the memory cell according to the invention.
Figure 11:
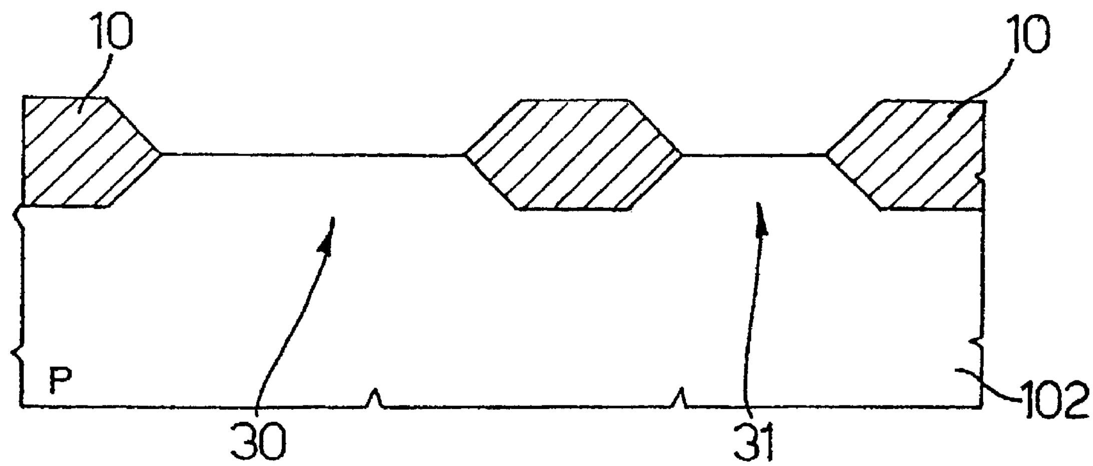
FIGS. 11–14 are transverse cross-sections, similar to the cross-section in FIG. 9, of the memory cell of FIG. 8, in successive steps of the production method.
Figure 12:
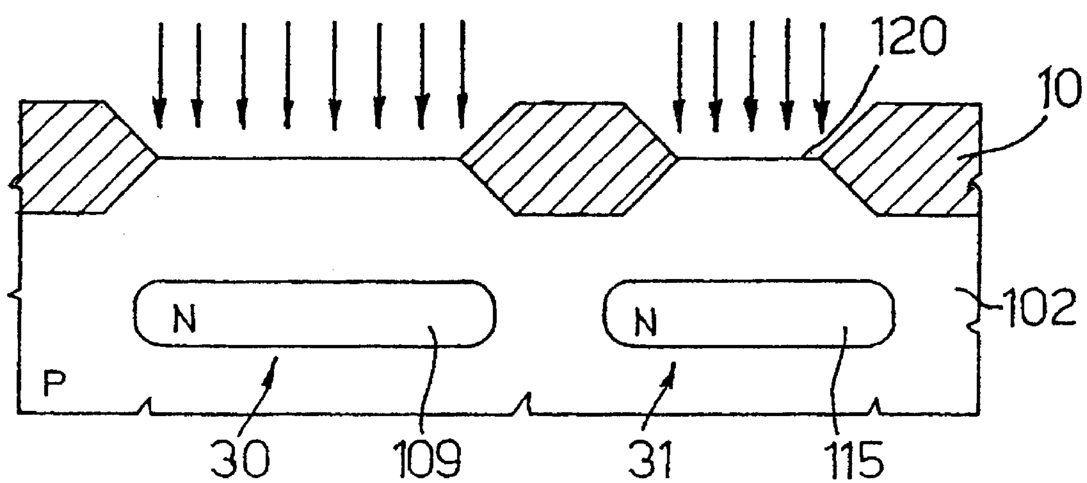
Figure 13:
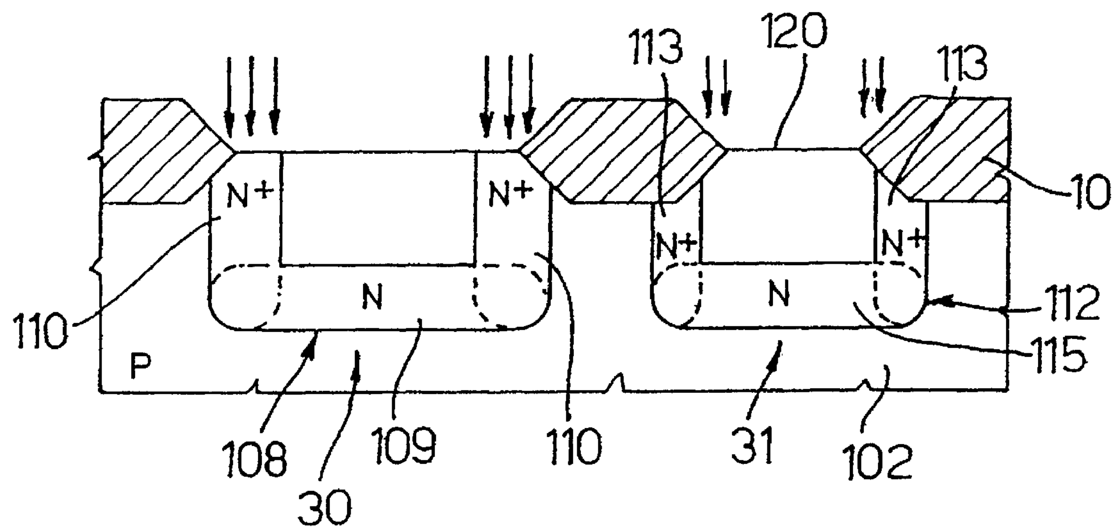

FIGS. 8, 9 and 10 show in detail a memory cell 101 of the flash EEPROM type, with a single level of polysilicon, included in a memory device 100 which comprises a substrate 102 of semiconductor material with a first type of conductivity, and in particular P.

Figure 1:
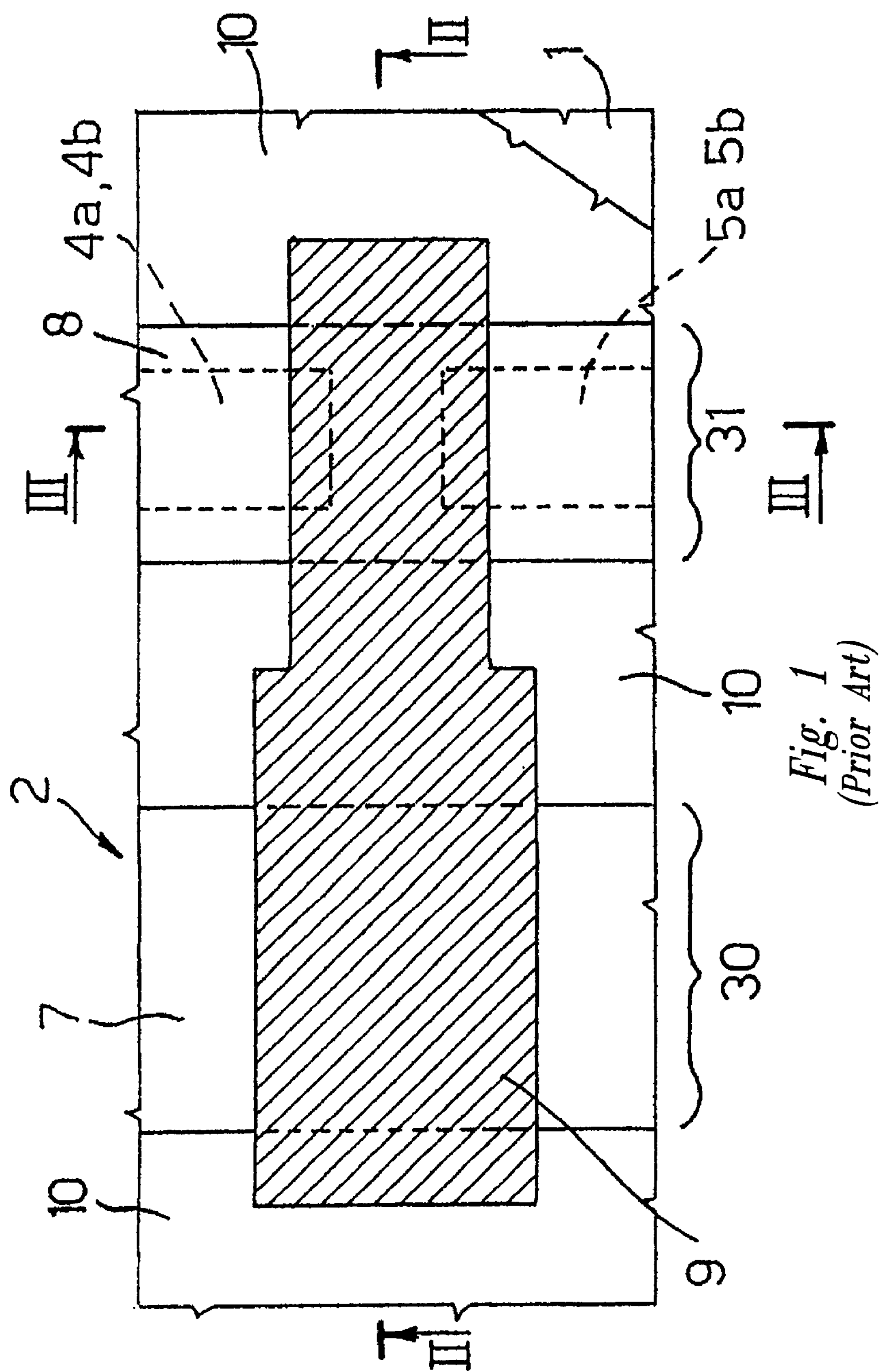
FIG. 1 is a plan view of a memory cell with a single level of polysilicon, of a known flash EEPROM type.
Figure 2:
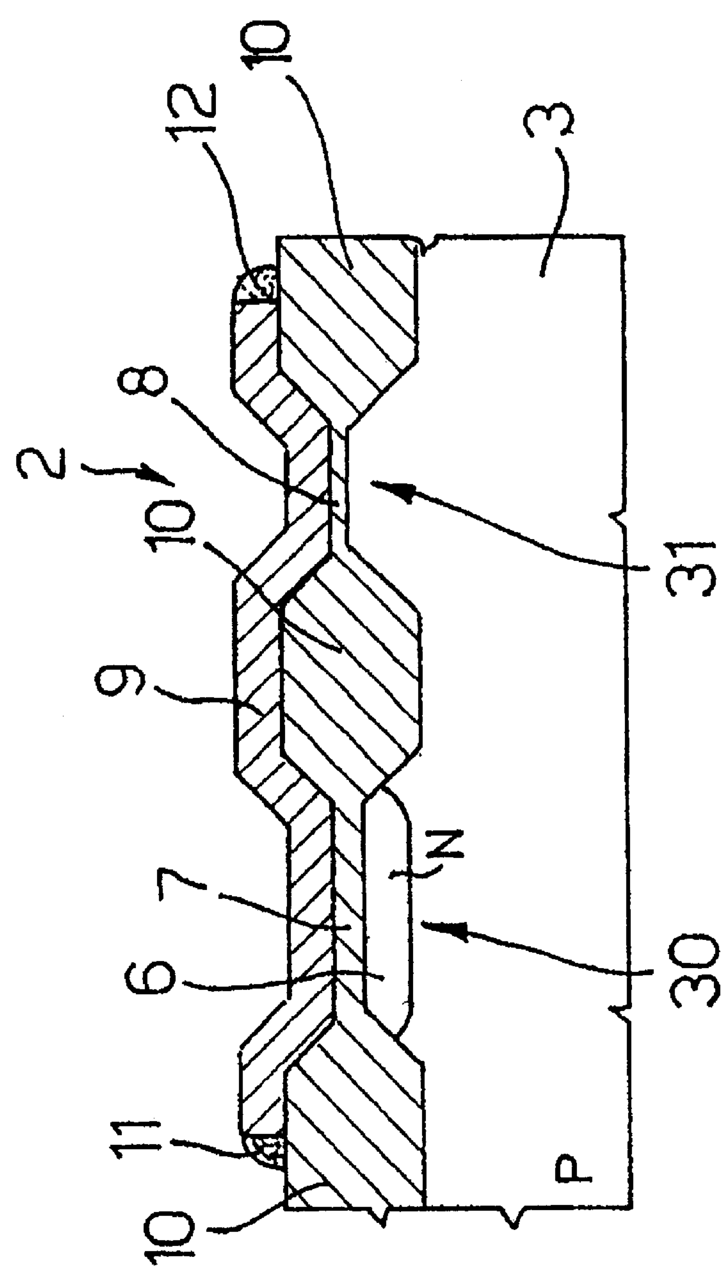
FIG. 2 is a transverse cross-section along line II—II in FIG. 1, of the known memory cell.
Figure 3:
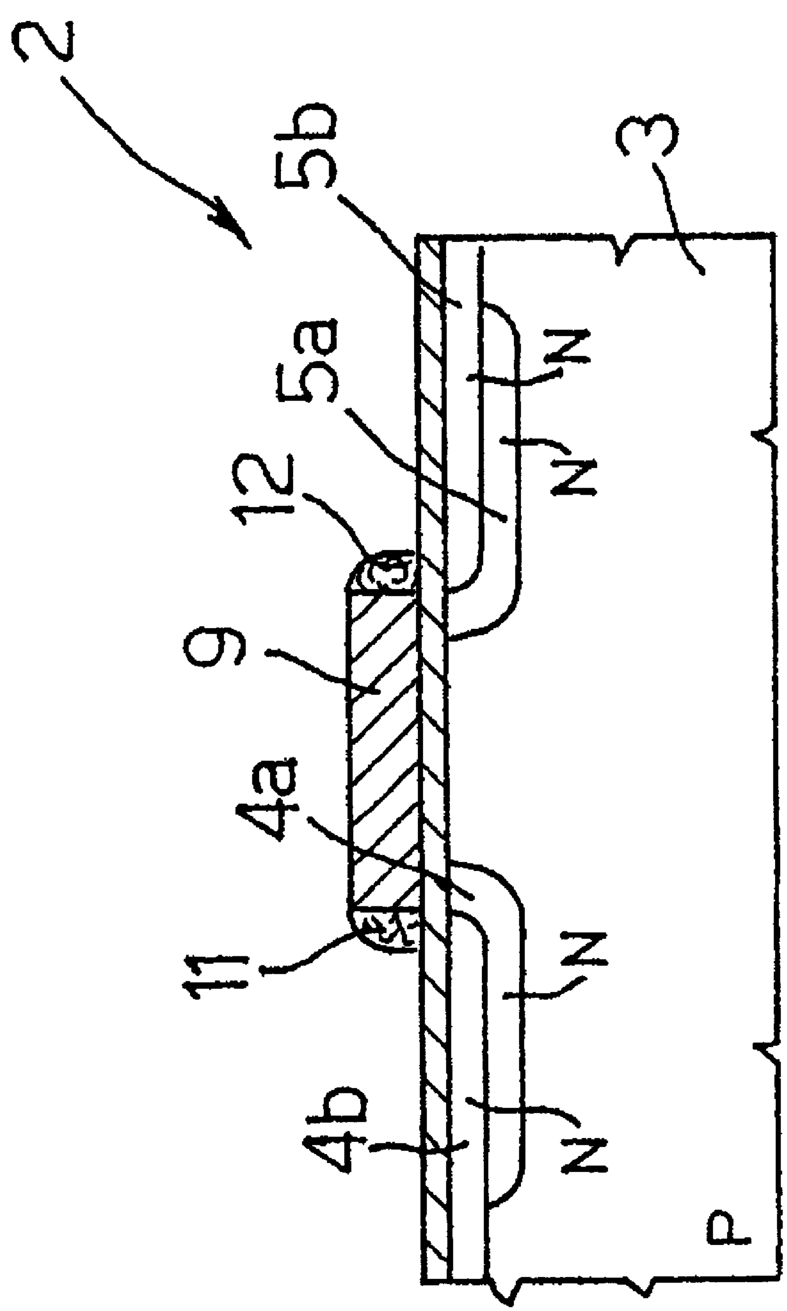
FIG. 3 is a transverse cross-section, along line III—III in FIG. 1, of the known memory cell.
Figure 4:
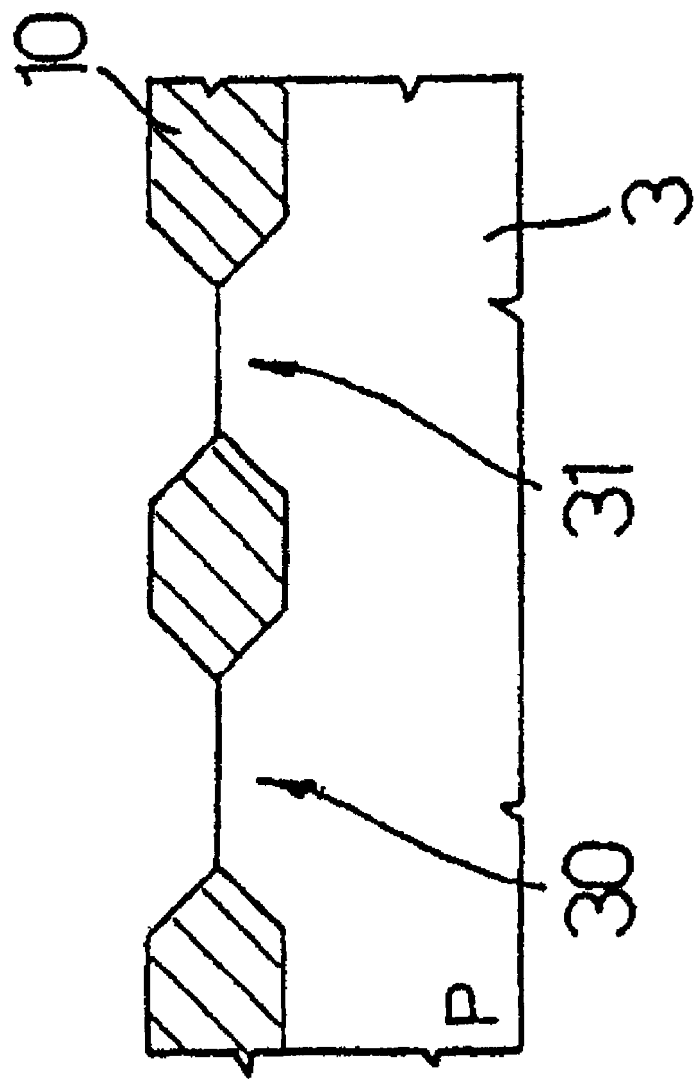
FIG. 4 is a transverse cross-section, similar to the cross-section shown in FIG. 2, of the known memory cell, in a first step of the production method.
Figures 5A, 5B:
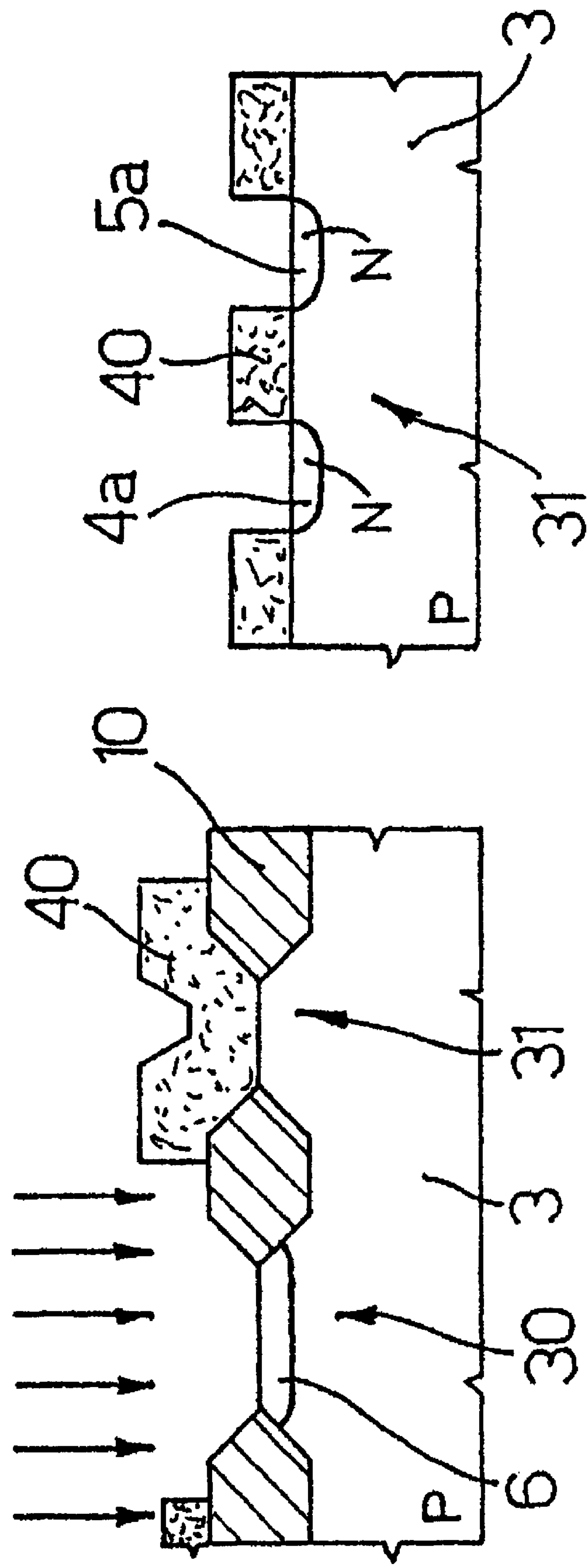
FIGS. 5*a* and 5*b* are transverse cross-sections, respectively along lines II—II and III—III in FIG. 1, in a successive production step of the known memory cell.
Figure 6B:
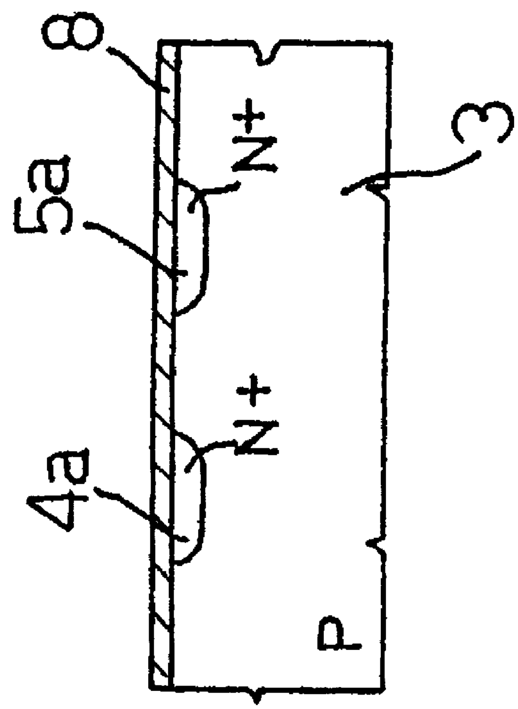
FIGS. 6*a* and 6*b* are transverse cross-sections similar to those in FIGS. 5*a*, 5*b*, in a subsequent production step.
Figure 6A:
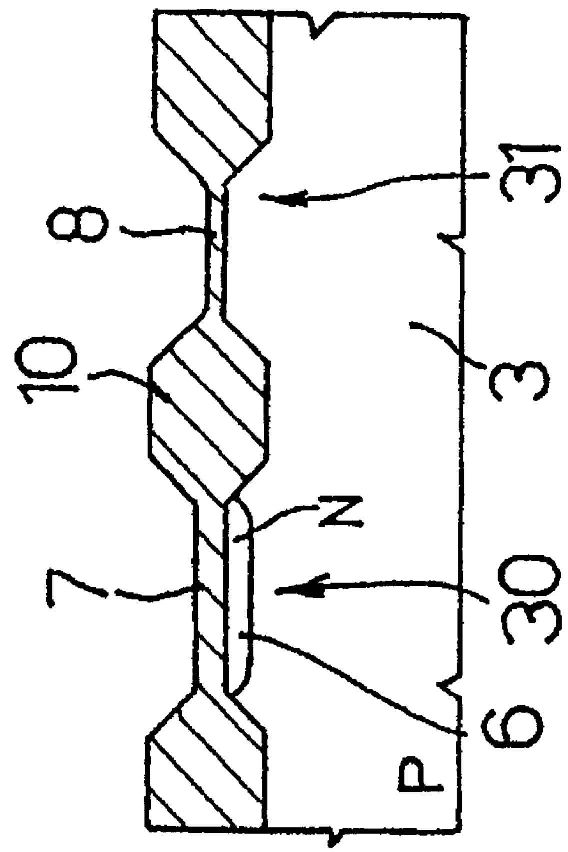
Figure 7B:
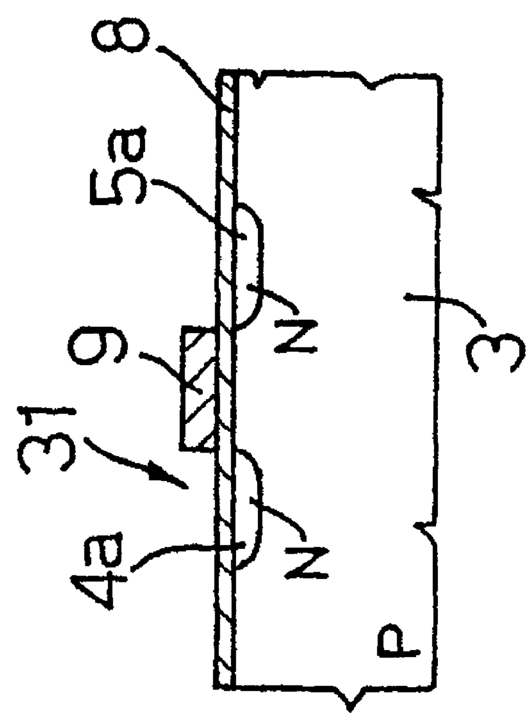
FIGS. 7*a* and 7*b* are transverse cross-sections similar to those in FIGS. 6*a*, 6*b*, in a subsequent production step.
Figure 7A:
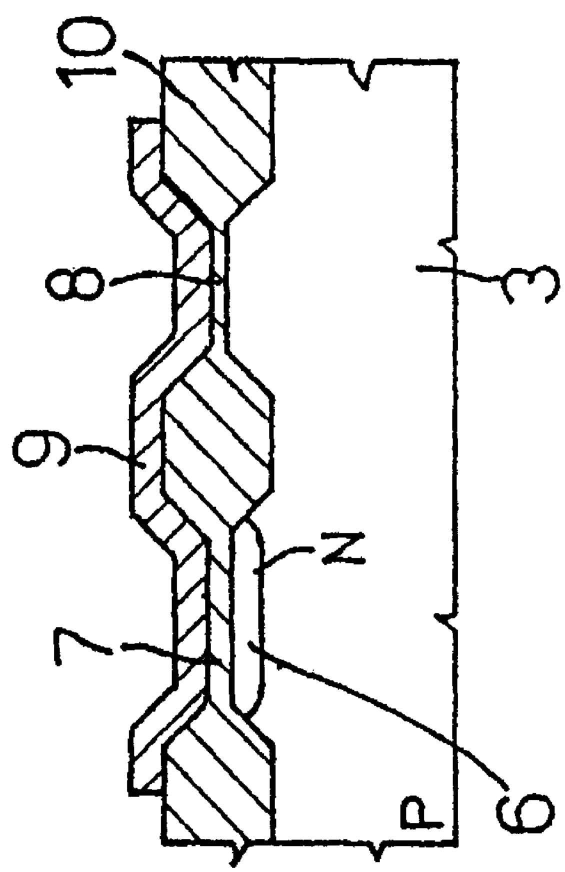

In greater detail, the memory cell 101 is similar to the known cell 1 in FIGS. 1–3, except for the fact that the diffuse control gate region 6 and the regions of source 4*a*, 4*b* and drain 5*a*, 5*b* each include a triple well.

In particular, the diffuse control gate region 6 and the regions of source 4*a*, 4*b* and drain 5*a*, 5*b* consist respectively of a first 103 and a second 104 well, which have the first type of conductivity. The first 103 and the second 104 well are in turn enclosed respectively in a third 108 and in a fourth 112 well, which have the second type of conductivity. In greater detail, the third well 108 consists of a first buried region 109, which is disposed below the first well 103, and a first deep region 110, which has conductivity of type N+, and a generally elongate annular shape, of which only two portions can be seen in the cross-section in FIG. 9. The first deep region 110 extends as far as the first buried region 109, such as to connect the latter to a surface 120 of the substrate 102, and to isolate the first well 103 completely from the remainder of the memory device 100.

Similarly, the fourth well 112 comprises a second buried region 115, which is formed below the second well 104, and a second deep region 113, which has conductivity of type N+, and an elongate annular shape, of which only two portions can be seen in FIG. 9. The second deep region 113 extends as far as the second buried region 115, such as to connect the latter to the surface 120 of the memory device 100, and to isolate the second well 104 completely from the remainder of the memory device 100.

Figure 14:
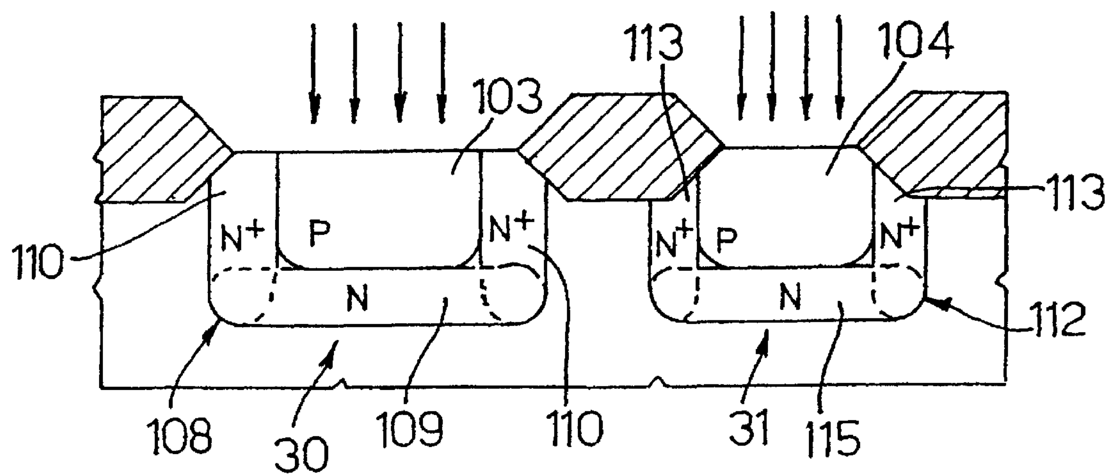

Many parts of the memory cell 101 are the same as those of the known memory cell 2 in FIGS. 1–3; thus they are provided with the same reference numbers as those previously used, and are not described again. On the other hand, FIGS. 11–14 show in succession some steps of the method for production of the memory cell 101. Starting from the substrate 102, after an initial step of definition of the first 30 and of the second 31 active region, by means of growth of the field oxide portions 10 (FIG. 11), there follow the steps of:

- high-energy implantation of a doping material, which in general is arsenic or phosphorous, at the first 30 and the second 31 active regions, in order to form at depth respectively the first 109 and the second 115 buried regions (FIG. 12);
- implantation and subsequent diffusion of a doping material, which in general is arsenic or phosphorous, in the first 30 and in the second 31 active regions along the perimeter, respectively, of the first 109 and of the second 115 buried regions. By this means there are formed the first deep region 110, which contacts the first buried region 109, in order to form the third well 108, and the second deep region 113, which contacts the second buried region 115, in order to form the fourth well 112 (FIG. 13);
- implantation and subsequent diffusion of a doping material, which in general is boron, inside the third well 108 and inside the fourth well 112, in order to form, respectively, the first 103 and the second 104 wells (FIG. 14).

The method for production of the memory cell 101 then proceeds with steps which are the same as those of the above-described known method, in particular with formation of the diffuse control gate region 6 in the first well 103, and of the regions of source 4*a* and drain 5*a* in the second well 104 (FIGS. 9 and 10); formation of the gate oxide region 7 and tunnel oxide region 8, formation of the floating gate region 9, formation of the self-aligned regions of source 4*b* and drain 5*b*, and formation of the spacers 11, 12.

The advantages of the memory cell described are as follows. Firstly, the memory cell 101 is more efficient, and makes it possible to obtain greater simplicity at the level of the circuitry which is provided for functioning of the cell. In fact, the isolation of the first and the second wells 103, 104 respectively from part of the third and the fourth wells 108, 112 permits greater freedom of polarization of the first and the second wells 103, 104, in relation to the known solutions. In particular, it is possible to polarize independently the wells 103, 104, such as to reduce the voltages applied to the memory cell 101 during the steps of programming and erasure of the cell itself, and thus to simplify the circuitry which is provided for generation and control of these voltages, for the same electrical fields necessary in these steps, and thus for the same efficiency of the cell.

In greater detail, during the step of erasure of the memory cell 101, instead of polarizing the source region 4*a*, 4*b* to high voltage (for example 14 V), it is possible to polarize negatively the diffuse control gate region 6 (for example to −7 V), and simultaneously to polarize the second well 104 positively (for example to 7 V), thus keeping unchanged the difference of potential between the diffuse control gate region 6 and the bulk region (which in this case is formed by the second well 104).

During the step of programming for injection of hot electrons, it is also possible to polarize the second well 104 negatively (for example to −1.5 V), and to polarize the diffuse control gate region 6 and the drain region 5*a*, 5*b* to a positive voltage which is lower than that previously necessary (for example 7 V instead of 9 V for the diffuse control gate region 6, and 3.5 V instead of 4.5 V for the drain region 5*a*, 5*b*). By polarizing also the source region 4*a*, 4*b* to ground, it is possible to obtain programming of the cell, for injection of hot electrons in a manner similar to that known, but using voltages with a lower absolute value, by this means simplifying the circuitry which is provided for generation and transfer of high voltages. As an alternative, it is possible to polarize the diffuse control gate region 6 to the voltage currently used (for example 8–9 V), thus increasing the efficiency of programming of the cell 101.

In addition, by means of the memory cell according to the invention, during programming it is possible to polarize the fourth well 112 to a voltage which is negative relative to the second well 104, such as to polarize directly the junction PN between these two wells 104, 112. For example, the fourth well 112 can be polarized to −2 V, and the second well 104 can be polarized to −1 V. By this means, the fourth well 112 functions as an injector (emitter) for electrons which can reach the floating gate region 9, and contribute towards programming of the cell 101, thus increasing the efficiency of programming.

Use of the memory cell 101 is highly advantageous in applications in which the memory device 100 is of the low-density type (for example of approximately 1 Kb), and is incorporated in an advanced-logic device, for example a microprocessor. In fact, in the methods for production of new-generation advanced-logic devices which use sub-micrometric technologies of, for example, approximately 0.18 μm, the use of triple wells has already been introduced. Consequently, the method for production of the memory cell 101 is highly compatible with these methods for production of the advanced logic devices, thus reducing as far as possible the additional production steps, and therefore the costs relating to production of the memory device 100, furthermore without detracting from the high performances levels of the advanced logic device.

Finally, it is apparent that many modifications and variants can be made to the memory cell and the production method described and illustrated here, all of which come within the scope of the inventive concept, as defined in the attached claims.

In particular, the memory cell can be either of the two-level type (and store a single bit), or of the multiple-level type (and store several bits). In addition, although the invention has been described with particular reference to the case of a memory cell of the flash EEPROM type, it can also be applied to the case of memory cells of the EPROM and OTP types etc.

What is claimed is:

1. A non-volatile memory cell with a single level of polysilicon, comprising:

a substrate of semiconductor material, which has a first type of conductivity;

a control gate region, with a second type of conductivity, formed in said substrate, in a first active region;

source and drain regions with the second type of conductivity, formed in said substrate, in a second active region, adjacent to said first active region;

a floating gate region extending above said substrate, transversely relative to said first and second active regions; and wherein said control gate region is produced in a first triple-well structure.

2. The memory cell according to claim 1, wherein said first triple-well structure comprises:

first isolation region, which has said second type of conductivity, and is formed in said first active region; and first isolated region, which has said first type of conductivity, and is enclosed below and laterally by said first isolation region, said first isolated region surrounding said control gate region.

3. The memory cell according to claim 1 wherein said source and drain regions are formed in a second triple-well structure.

4. The memory cell according to claim 3, wherein said second triple-well structure comprises:

second isolation region, which has said second type of conductivity, and is formed in said second active region; and second isolated region, which has said first type of conductivity, and is enclosed below and laterally relative to said second isolation region, said second isolated region having said source and drain regions therein.

5. A method for production of a non-volatile memory cell with a single level of polysilicon, comprising the steps of:

forming, in a first active region of a substrate of semiconductor material with a first type of conductivity, a control gate region with a second type of conductivity;

forming, in a second active region of said substrate adjacent to said first region of active area, source and drain regions which have said second type of conductivity;

forming on said substrate a floating gate region of semiconductor material, said floating gate region extending transversely relative to said first and second active regions; and producing a first triple-well structure in said first active region.

6. The method according to claim 5, wherein said step of producing a first triple-well structure comprises the steps of:

forming a first isolation region, with said second type of conductivity, in said first active region; and forming a first isolated region with said first type of conductivity, in said first isolation region, wherein said control gate region is produced inside said first isolated region.

7. The method according to claim 6, wherein a second triple-well structure is produced in said second active region.

8. The method according to claim 7, wherein said step of producing a second triple-well structure comprises the steps of:

forming a second isolation region, with said second type of conductivity, in said second active region;

forming a second isolated region with said first type of conductivity, in said second isolation region; and producing said regions of source and drain inside said second isolated region.

9. The method according to claim 8, wherein said steps of forming first and second isolation regions comprise the steps of:

forming, in said first and said second active regions, a first and a second buried region with said second type of conductivity, said first and second buried regions spaced from a surface of said substrate; and forming, in said first and said second active regions, a first and a second deep region with said second type of conductivity, said first and second deep regions having a shape which is substantially annular, and extending from said surface of said substrate as far as respective perimeter portions of said first and second buried regions.

10. The method according to claim 9, wherein said step of forming a first and a second buried region comprises the step of implanting at depth a first doping material with said second type of conductivity.

11. The method according to claim 9 wherein said steps of forming a first and a second isolated region comprise the step of implanting a second doping material with the first type of conductivity, inside said first and second deep regions.

12. A non-volatile memory cell, comprising:

a semiconductor substrate having a first conductivity type and including a first active region;

a floating gate region positioned above the substrate;

drain and source regions positioned in the substrate; and a control gate region formed in a first isolated region of the first active region, the first isolated region being defined on a lateral side by a first isolating region and defined on a bottom side by a first buried region.

13. The memory cell of claim 12 wherein the drain and source regions are formed in a second active region of the substrate and the floating gate region is positioned above the second active region.

14. The memory cell of claim 13 wherein the floating gate region extends above the first and second active regions and is separated from the substrate by an oxide layer.

15. The memory cell of claim 12 wherein the first isolating region laterally surrounds the first isolated region.

16. The memory cell of claim 12 wherein the drain and source regions are formed in a second isolated region of a second active region of the substrate, the second isolated region being defined on a lateral side by a second isolating region and defined on a bottom side by a second buried region.

17. The memory cell of claim 16 wherein the second isolating region laterally surrounds the second isolated region.

18. The memory cell of claim 16 wherein the floating gate has a length that extends over the first and second isolated regions and-the first and second isolated regions have a length that is transverse to the length of the floating gate.

19. The memory cell of claim 16 wherein the first and second isolating regions each have an elongated annular shape.

20. The memory cell of claim 12 wherein the first isolated region has the first conductivity type and the first isolating region, first buried region, and control gate region all have a second conductivity type opposite to the first conductivity type.

21. A non-volatile memory cell with a single level of polysilicon, comprising:

a semiconductor substrate having a first conductivity type;

a first triple well structure formed in the semiconductor substrate;

a control gate region having a second conductivity type, formed in a first active region in the semiconductor substrate within the first triple well structure;

a second ripple well structure formed in the semiconductor substrate;

source and drain regions having the second conductivity type, formed in a second active region in the semiconductor substrate within the second triple well structure; and a floating gate region extending above the semiconductor substrate and extending across the first and second active regions.

* * * * *

UNITED STATES PATENT AND TRADEMARK OFFICE

CERTIFICATE OF CORRECTION

PATENT NO. : 6,410,389 B1

DATED : June 25, 2002

INVENTOR(S) : Paolo Cappelletti et al.

It is certified that error appears in the above-identified patent and that said Letters Patent is hereby corrected as shown below:

Column 6,
Lines 26, 27 and 28, "wherein said control gate region is produced inside said first isolated region." should read as -- forming said control gate inside said first isolated region. --.

Signed and Sealed this

Third Day of December, 2002

JAMES E. ROGAN
*Director of the United States Patent and Trademark Office*